United States Patent
Ecton et al.

(10) Patent No.: US 11,670,504 B2
(45) Date of Patent: Jun. 6, 2023

(54) ULTRA-THIN DIELECTRIC FILMS USING PHOTO UP-CONVERSION FOR APPLICATIONS IN SUBSTRATE MANUFACTURING AND INTEGRATING PASSIVES

(71) Applicant: Intel Corporation, Santa Clara, CA (US)

(72) Inventors: Jeremy D. Ecton, Gilbert, AZ (US); Brandon C. Marin, Chandler, AZ (US); Andrew J. Brown, Phoenix, AZ (US); Dilan Seneviratne, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 781 days.

(21) Appl. No.: 16/419,426

(22) Filed: May 22, 2019

(65) Prior Publication Data
US 2020/0373157 A1    Nov. 26, 2020

(51) Int. Cl.
  *H01L 21/02* (2006.01)
  *H01L 23/532* (2006.01)
  *H01L 21/768* (2006.01)
  *H01L 49/02* (2006.01)

(52) U.S. Cl.
CPC .. *H01L 21/02345* (2013.01); *H01L 21/02118* (2013.01); *H01L 21/02167* (2013.01); *H01L 21/02194* (2013.01); *H01L 21/76825* (2013.01); *H01L 21/76841* (2013.01); *H01L 23/5329* (2013.01); *H01L 23/53228* (2013.01); *H01L 28/60* (2013.01)

(58) Field of Classification Search
None
See application file for complete search history.

(56) References Cited

U.S. PATENT DOCUMENTS

2020/0249570 A1* 8/2020 Talapin .............. C09K 11/7773
2020/0369955 A1* 11/2020 Park ......................... C09D 4/06

FOREIGN PATENT DOCUMENTS

CN          108300153 A   *  7/2018  ............. B32B 15/08
KR         2013096821 A   *  9/2013

OTHER PUBLICATIONS

Machine language translation of KR 10-2013-0096821 A (Year: 2013).*
Machine language translation of CN-108300153-2018A (Year: 2018).*

* cited by examiner

*Primary Examiner* — Erik Kielin
(74) *Attorney, Agent, or Firm* — Schwabe, Williamson & Wyatt, P.C.

(57) ABSTRACT

A thin-film insulator comprises a first electrode over a substrate. A photo up-converting material is over the first electrode. A cured photo-imageable dielectric (PID) containing a high-k filler material is over the photo up-converting material, wherein the cured PID is less than 4 μm in thickness, and a second electrode is over the cured PID.

23 Claims, 9 Drawing Sheets

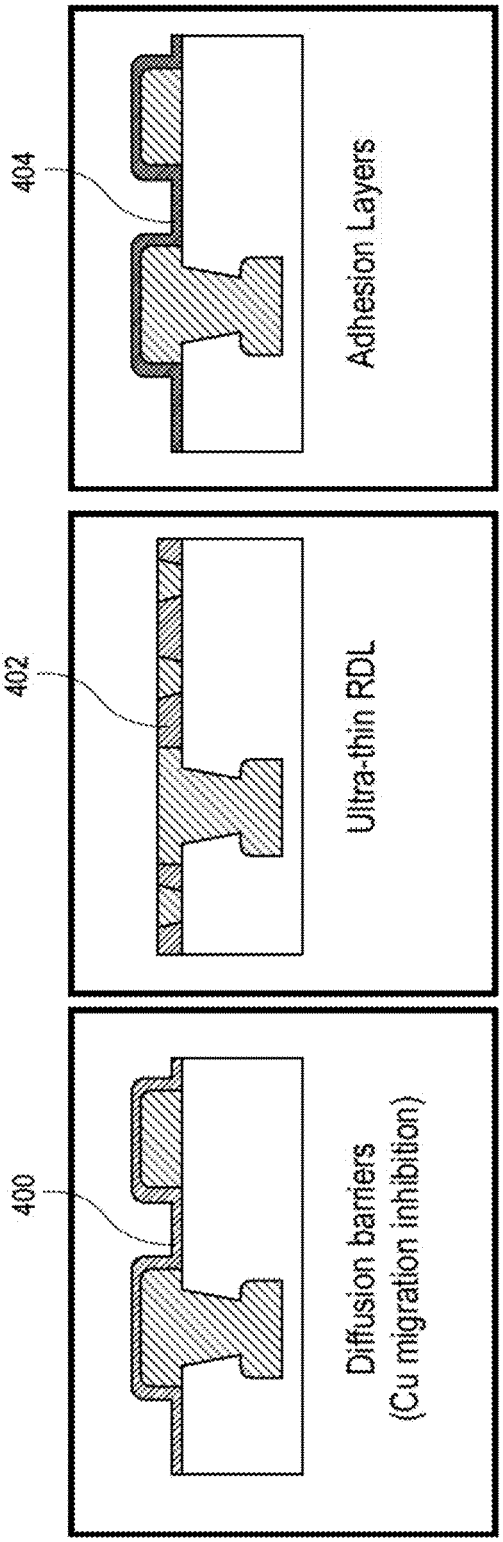

| Filler Material | k | % filler composition (loading) | effective k | d (nm) | C/A (uF/cm2) | Approximated Effective Breakdown Voltage(kV/mm) | Maximum Operating Voltage (V) |
|---|---|---|---|---|---|---|---|
| BaTiO3 | 7,000 | 70% | 50 | 50 | 0.884 | 140 | 7 |
| SrTiO3 | 3,000 | 70% | 25 | 50 | 0.442 | 140 | 7 |
| Ni-BaTiO3 | 80,000 | 70% | 100 | 50 | 1.768 | 140 | 7 |
| BaTiO3 | 7,000 | 70% | 50 | 100 | 0.442 | 140 | 14 |
| SrTiO3 | 3,000 | 70% | 25 | 100 | 0.221 | 140 | 14 |
| Ni-BaTiO3 | 80,000 | 70% | 100 | 100 | 0.884 | 140 | 14 |
| BaTiO3 | 7,000 | 70% | 50 | 200 | 0.221 | 140 | 28 |
| SrTiO3 | 3,000 | 70% | 25 | 200 | 0.111 | 140 | 28 |

FIG. 5B

ULTRA-THIN DIELECTRIC FILMS USING PHOTO UP-CONVERSION FOR APPLICATIONS IN SUBSTRATE MANUFACTURING AND INTEGRATING PASSIVES

TECHNICAL FIELD

Embodiments of the disclosure are in the field of integrated circuit structures and, in particular, ultra-thin dielectric films using photo up-conversion for applications in substrate manufacturing and integrated passives.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips and semiconductor packages.

For example, thin dielectric films are desired for a variety of applications in substrate manufacturing, yet few methods are available to form thin, uniform dielectric films. Typically, the thickness of the film in substrate packaging is dependent on the dielectric film supplier material availability/capability which range in value between 5 µm and 100 µm in thickness. Methods to form thin films in substrate packaging typically include spin coating, spray coating, or slit coating.

For a semiconductor packaging form factor (panel-level), however, none of the methods above is currently implemented in high-volume manufacturing (HVM). For example, performing spin coating on a square form factor, such as a panel, leads to edge defects and uniformity issues. Slit-coating and spray coating are relatively immature in the industry and material viscosity can limit their thin-film coating capability below 1 µm.

Variability in conventional and state-of-the-art fabrication processes may limit the possibility to form thin films below the sub-5 µm range. Consequently, fabrication of the functional components needed for future technology nodes may require the introduction of new methodologies or the integration of new technologies in current fabrication processes or in place of current fabrication processes.

BRIEF DESCRIPTION OF THE DRAWINGS

FIGS. 4A to 4C are diagrams illustrating additional applications for forming ultra-thin dielectric films using a photo up-conversion process in conjunction with a PID.

FIG. 5B is a table showing example high-k filler materials and associated properties when used to form the TFC of FIG. 1.

DESCRIPTION OF THE EMBODIMENTS

Figure 1:
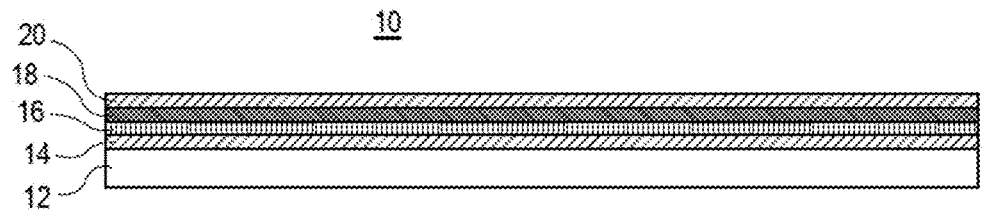
FIG. 1 illustrates a cross-section diagram of a thin-film insulator stack of materials comprising thin film capacitor (TFC) formed using the photo up-conversion process.

Ultra-thin dielectric films using photo up-conversion for applications in substrate manufacturing are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference, which is made clear by reference to the text and the associated drawings describing the component under discussion. Such terminology may include the words specifically mentioned above, derivatives thereof, and words of similar import.

As described above, the thickness of conventional dielectric film material used in substrate packaging typically ranges between 5 µm and 100 µm in thickness.

In accordance with one or more embodiments described herein, ultra-thin (e.g., <1 µm) dielectric layers for substrate packaging are fabricated using photopolymerization or photoinitiated polymerization. Photopolymerization is a material synthesis technique in which electromagnetic energy is used to irradiate a thin layer of photopolymer resin, which is a mixture of low molecular weight monomers capable of chain-reacting to form long-chain polymers under a light or radiation source of appropriate wavelength. Example types of electromagnetic energy include ultraviolet (UV), 100-400 nm, visible light, 400-800 nm, and infrared (IR) at 800-2500 nm.

In one or more embodiments, a photo-imageable dielectric (PID) material is used in conjunction with an inexpensive, scalable, photo up-conversion (i.e., photopolymerization) process to form ultra-thin dielectric layers of less than 4 µm in thickness, and in some embodiments less than 1 µm. Such a technology can be used for a variety of applications where thin dielectric layers are needed including but not limited to: i) integration of high-k materials used for thin film capacitors (TFCs) or other passives embedded within the substrate; ii) forming ultra-thin layers for redistribution (RDL); iii) forming diffusion barriers; iv) forming adhesion promoting layers; and v) forming passivation layers. Such a thin-film insulator may improve the functionality of semiconductor packaging.

FIG. 1 illustrates a cross-section diagram of a thin-film insulator stack of materials comprising thin film capacitor (TFC) formed using the photo up-conversion process. In embodiments, the TFC 10 comprises a substrate 12 and a bottom electrode 14 over the substrate 12. In accordance with the disclosed embodiments, a photo up-converting material 16 is over the bottom electrode 14. During fabrication, an uncured photo-imageable dielectric (PID) containing a high-k filler material (not shown) is formed over the photo up-converting material 16 and exposed to light. The photo up-converting material 16 up-converts the light and hardens the uncured PID into a thin layer of cured PID material 18 over the photo up-converting material 16 as a result of a curing process that crosslinks polymers in a bottom portion of the uncured PID. In one embodiment, the cured PID material 18 is less than 4 μm in thickness and in some embodiments, less than 1 μm. A top electrode 20 is formed over the cured PID 18 to complete the TFC 10.

In one embodiment, the cured PID 18 containing the high-k filler material may include, but is not limited to, barium titanate, strontium titanate, barium and strontium titanate silicon carbides, nickel titanate, barium titanate, nickel and barium titanates, iron-doped fluoropolymers, and polyfluorovinyl polymers.

In one embodiment, the cured PID is approximately 20 nm to 3 μm in thickness, the photo up-converting material is approximately 10 to 50 nm in thickness, and the first electrode and the second electrode comprise copper and are approximately 100 nm to 5 μm in thickness.

Figure 2A:
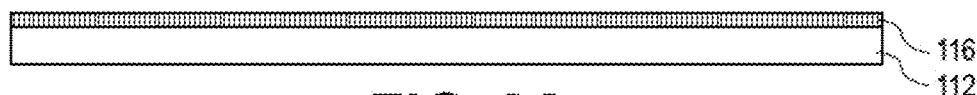
FIGS. 2A to 2E are flow diagrams illustrating a fabrication process for forming a thin-film insulator stack of materials using photo-up conversion in accordance with the disclosed embodiments.
Figure 2B:
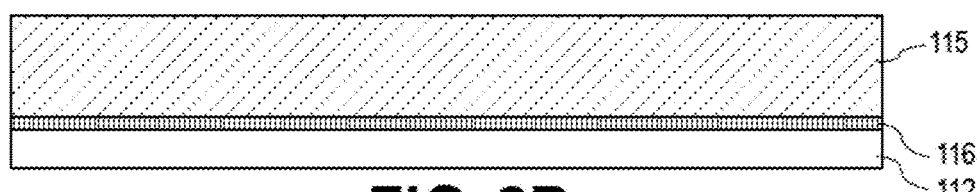

FIGS. 2A to 2E are flow diagrams illustrating a fabrication process for forming a thin-film insulator stack of materials (without electrodes) using photo-up conversion in accordance with the disclosed embodiments. FIG. 2A shows the process after a photo up-converting material 116 is formed over substrate 112. FIG. 2B shows the process after an uncured photo-imageable dielectric (PID) 115 is formed over the photo up-converting material 116. In one embodiment, the PID 115 is laminated over the photo up-converting material 116. In one embodiment, the PID 115 may comprise a photopolymer resin comprising a mixture of low molecular weight monomers capable of chain-reacting to form long-chain polymers once exposed to electromagnetic energy.

Figure 2C:
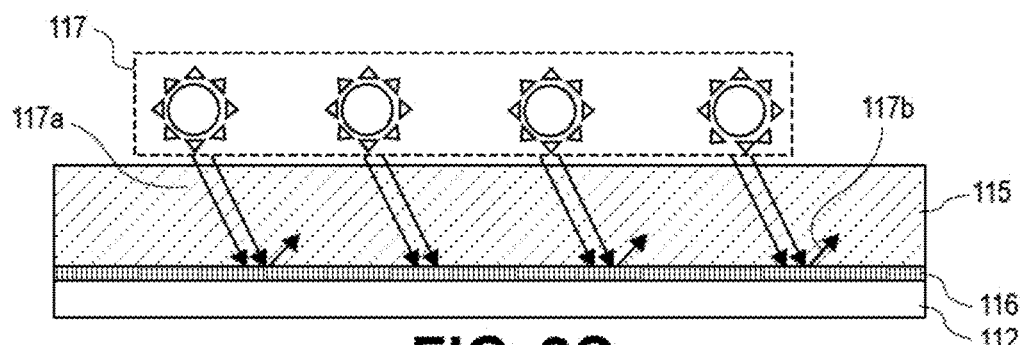

FIG. 2C shows the process as a light source 117 exposes or irradiates the PID 115 with low electromagnetic energy, such as infrared (IR) or near IR, but other types of electromagnetic energy may be used such as visible light or ultraviolet (UV). In some embodiments, low electromagnetic energy 117a shines (e.g., IR) through the PID 115 to the photo up-converting material 116, and in response the photo up-converting material 116 emits high electromagnetic energy 117b (e.g., UV light) via multi-photon absorption of the low electromagnetic energy. The high electromagnetic energy 117b cures or polymerizes the monomers comprising the PID 115 in close vicinity of the focal spot. In other words, the high electromagnetic energy 117b crosslinks a bottom portion of the PID 115 to form a cured dielectric layer over the photo up-converting material 116, and an uncured portion of the PID 115 over the cured dielectric layer.

Figure 2D:
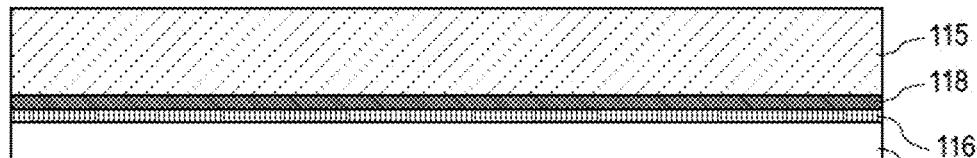

FIG. 2D shows that the bottom portion the uncured PID 115 hardens into a thin layer of cured PID material 118 over and on the photo up-converting material 116 as a result of the curing process. In one embodiment, the cured dielectric layer is less than 4 μm in thickness and in some embodiments less than 1 μm. The depth of the curing and hence the thickness of the cured PID material 118 can be controlled by varying one or more parameters such as light intensity, photoinitator concentration of the PID 115, monomer reactivity, and temperature.

Figure 2E:
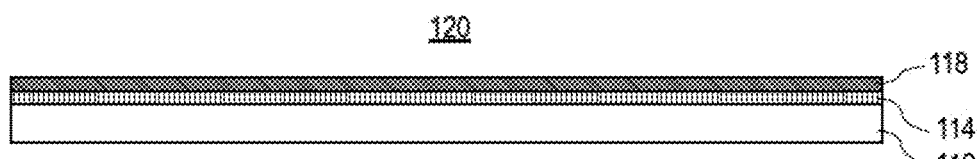

FIG. 2E shows the process after the remaining uncured PID 115 is removed to create the thin-film insulator stack 120. In embodiments, the remaining uncured PID 115 is removed following a developing process using, including but not limited to, sodium carbonate, TMAH, or cyclopentanone, for example.

FIGS. 3A to 3F are flow diagrams illustrating a fabrication process for forming a thin-film capacitor using photo-up conversion in accordance with the disclosed embodiments. The process is similar to the above process but includes formation of top and bottom electrodes. According to a further aspect of the disclosed embodiments, the PID may be doped with other materials, including, for example, a high dielectric constant material, piezoelectric material, thermoelectric material, diamagnetic material, paramagnetic material, and the like, as described in the example below.

Figure 3A:
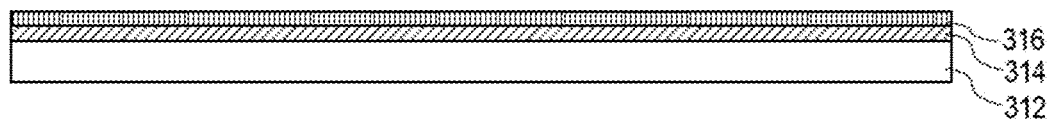
FIGS. 3A to 3F are flow diagrams illustrating a fabrication process for forming a thin-film capacitor using photo-up conversion in accordance with the disclosed embodiments.

FIG. 3A illustrates a bottom electrode 314 formed over a substrate 312, and photo up-converting material 316 formed over the bottom electrode 314. In one embodiment, the substrate 312 may comprise any suitable material, such as ajinomoto-build-up-film (ABF), and the bottom electrode 314 may comprise any suitable metal, such as copper.

Figure 3B:
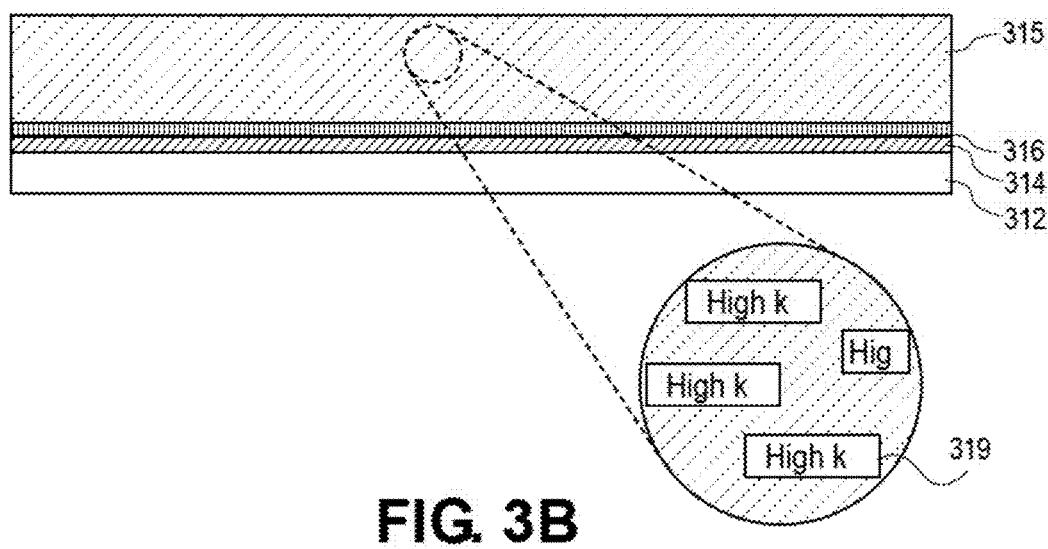

FIG. 3B illustrates an uncured photo-imageable dielectric (PID) doped with material exhibiting a high dielectric constant, hereinafter referred to as a high-k material 319 and in the case of a photo-imageable dielectric, a high-k PID 315, formed over the photo up-converting material 316. In one embodiment, the high-k PID 315 is laminated over the photo up-converting material 316. In one embodiment, the high-k PID 315 may comprise a photopolymer resin, which is a mixture of low molecular weight monomers capable of chain-reacting to form long-chain polymers once exposed to optical energy.

Figure 3C:
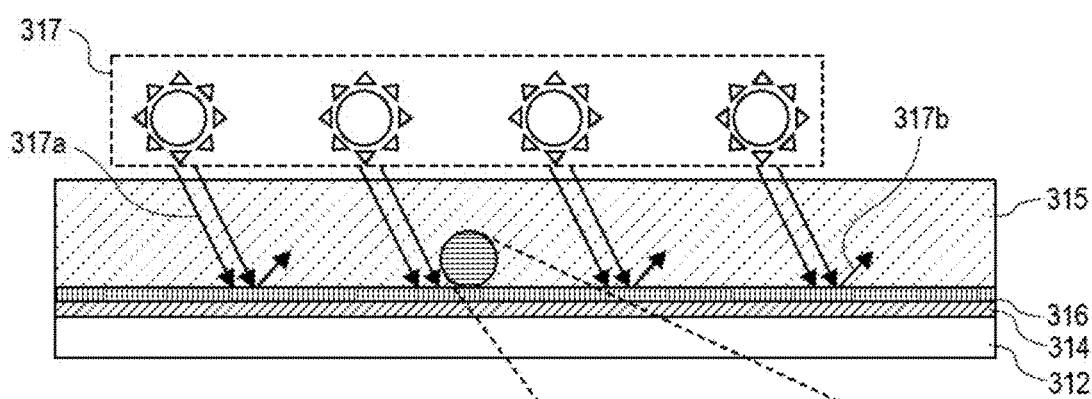

FIG. 3C illustrates a light source 317 irradiating the high-k PID 315 with low electromagnetic energy, such as infrared (IR) or near IR, but other types of electromagnetic energy may be used such as visible light or ultraviolet (UV). In one specific embodiment, a low energy infrared light 317a shines through the high-k PID 315 to the photo up-converting material 16, and the photo up-converting material 316 up converts the low energy infrared light 17a into high energy UV light 317b. The high energy UV light 317b is absorbed by the high-k PID 315 and polymerized into cured high-k PID 318 (i.e., a cross-linked PID doped with high-k material 319).

Figure 3D:
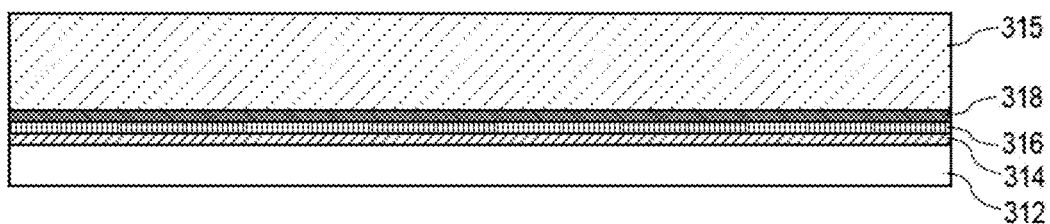

FIG. 3D illustrates hardening of the uncured high-k PID 315 into a thin layer of cured high-k PID 318 over and on the photo up-converting material 316 as a result of the curing process that crosslinks monomers in the uncured high-k PID 315. The depth of the curing and hence the thickness of the cured high-k PID 318 is a function of parameters such as light intensity, photoinitator concentration of the high-k PID 315, monomer reactivity, and/or temperature.

Figure 3E:
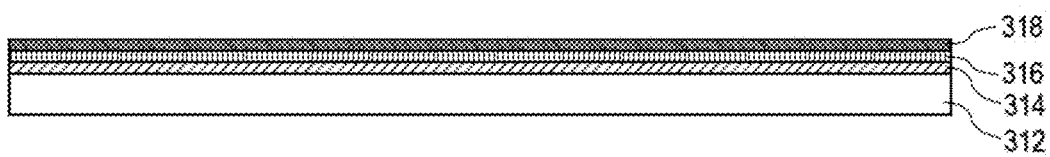
Figure 3F:
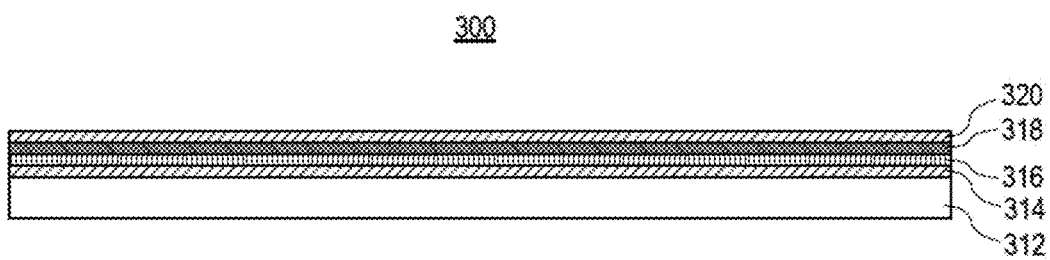

FIG. 3E illustrates removal of the remaining uncured high-k PID 315 over the cured high-k PID 318. FIG. 3F illustrates a top electrode 320 formed over the cured high-k PID 318 to form the thin-film insulator stack 300.

In accordance with the disclosed embodiments, method forming ultra-thin dielectric films using a photo up-conversion process in conjunction with a PID can be applied to multiple applications and uses existing lamination technology, thus making it a cost effective and simple method to form ultra-thin dielectric films. The photo up-conversion process has multiple applications with multiple advantages, which all translate to improving functionality of a package and thus increasing the competitiveness of products in a cost-effective manner. For instance, one example is the fabrication of high-k films, which increases the number of embedded passives within a layer, thus adding functionality and performance to a semiconductor package. Other applications and advantages are addressed below with reference to FIGS. 4A to 4C.

FIGS. 4A to 4C are diagrams illustrating additional applications for forming ultra-thin dielectric films using a photo up-conversion process in conjunction with a PID. FIG. 4A illustrates the use of thin dielectric films to form diffusion barriers 400 (e.g., for Cu migration inhibition). Photo up-conversion is a cost-effective way to form diffusion barriers 400, while not significantly adding z-height, and thus improving the reliability of a package.

FIG. 4B illustrates the use of thin dielectric films for redistribution (RDL) 402. The photo up-conversion process reduces the z-height of the RDL 402, thus enabling the number of layers to be increased and hence increased functionality for a package.

FIG. 4C illustrates the use of thin dielectric films to form adhesion-promoting layers 404. Adhesion-promoting layers 404 improve Cu adhesion in a package, and the photo up-conversion layer does not significantly add z-height.

In one embodiment, the photo up-converting material comprises a nanoparticle solid-state emitter or an organic phosphor-type emitter as sensitizers. For example, the nanoparticle solid-state emitter may comprise CdSe quantum dots, CuS nanodisks, or metal nanoparticle-infused polymers. Table 1 shows candidate phosphors and nanoparticle solid-state sensitizers, and wavelengths thereof, suitable for use as the photo up-converting material.

TABLE 1

| (1) Phosphors | | |
| --- | --- | --- |
| PtTPBP/Perylene | TPBP/2CBPEA | PdPh4TBP/BPEA |
| $\lambda_{abs}$ = 635 nm | $\lambda_{abs}$ = 635 nm | $\lambda_{abs}$ = 635 nm |
| $\lambda_{emission}$ = 451 nm | $\lambda_{emission}$ = 490 nm | $\lambda_{emission}$ = 490 nm |
| (2) Nanoparticle Solid State Sensitizers | | |
| CdSe | | CuS |
| $\lambda_{abs}$ = 800-1000 nm | | $\lambda_{abs}$ = 950-1200 nm |
| $\lambda_{emission}$ = 500-650 nm | | $\lambda_{emission}$ = 450-600 nm |

In another embodiment, the photo up-converting material may comprise a dual-high-k/up-converting layer comprising Er and Yb-doped barium and strontium titanates.

Figure 5A:
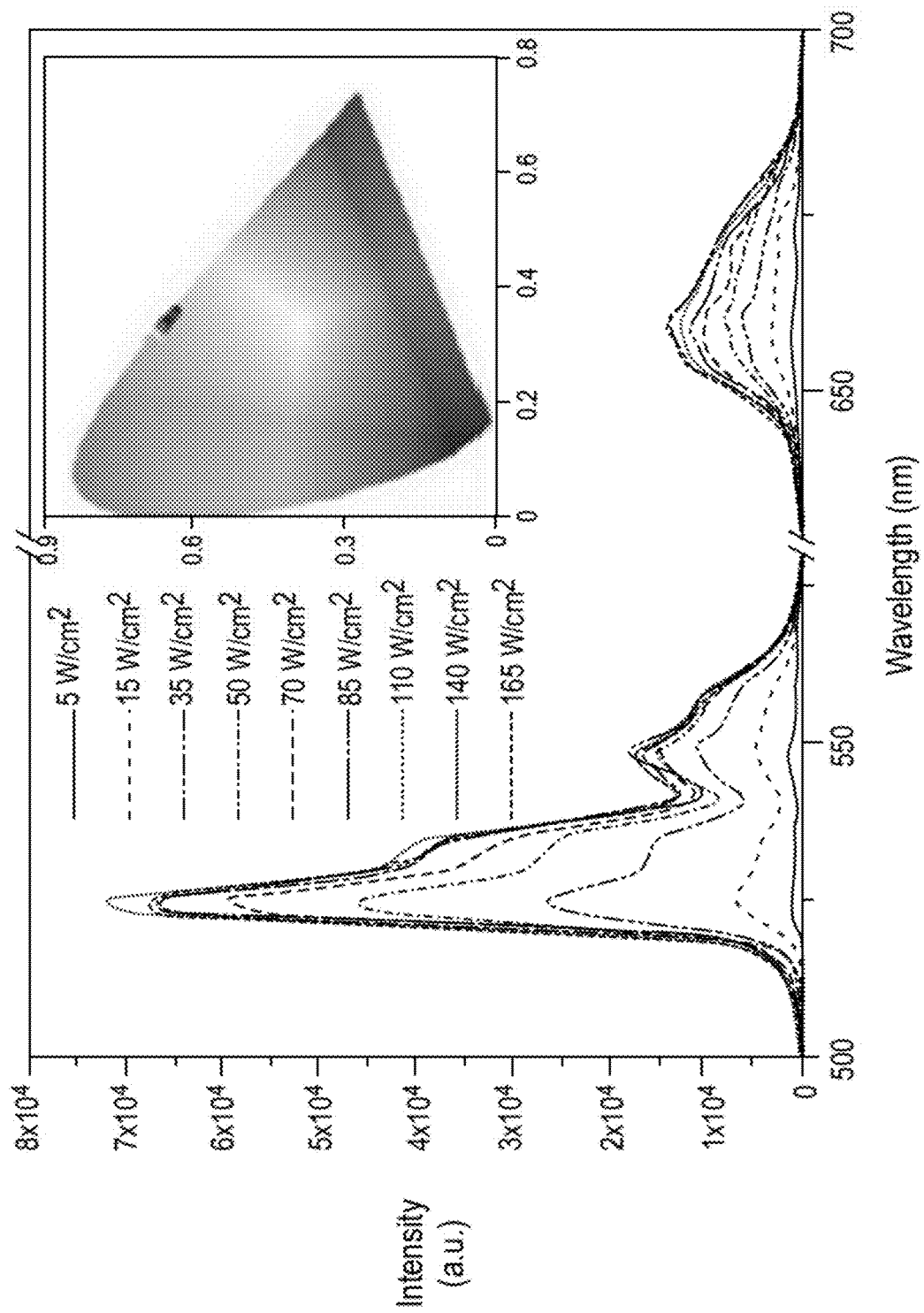
FIG. 5A is a graph illustrating emission spectra of Er and Yb doped barium titanate, which can be used as a dual-high-k/photo up-converting layer.

FIG. 5A is a graph illustrating emission spectra of Er and Yb doped barium titanate, which can be used as a dual-high-k/photo up-converting layer. The x-axis represents wavelengths from 500 to 700 nm, and the y-axis represents intensity from 0 to 8×10$^4$. The upper right of portion of the graph illustrates variation of up-conversion emission intensity with input excitation power.

As stated above, the PID may also contain high-k filler materials that may include, but are not limited to, barium and strontium titanates, silicon carbide, nickel barium titanates, iron-doped fluoropolymers, and polyfluorovinyl polymers. An example use of the high-k PID is formation of TFCs.

FIG. 5B is a table showing example high-k filler materials and associated properties when used to form the TFC of FIG. 1. The properties for each listed high-k filler material include dielectric constant values, thickness (d), a capacitance value, approximate effective breakdown voltage, and maximum operating voltage. For high-k filler materials comprising barium titanates, the table conservatively shows a capacitance as high as 1.768 µF/cm2. The breakdown voltages for the high-k materials may be based from process data acquired for epoxy-based buildup films. The breakdown voltage that is approximated (~140 kV/mm) is the lowest measured and encompasses the worst-case scenario. It should be noted, the maximum voltage ranges (7-28 V) listed for the TFC of the described embodiments is well outside the operating region of most capacitors in packaging (4-6 V).

Figure 5C:
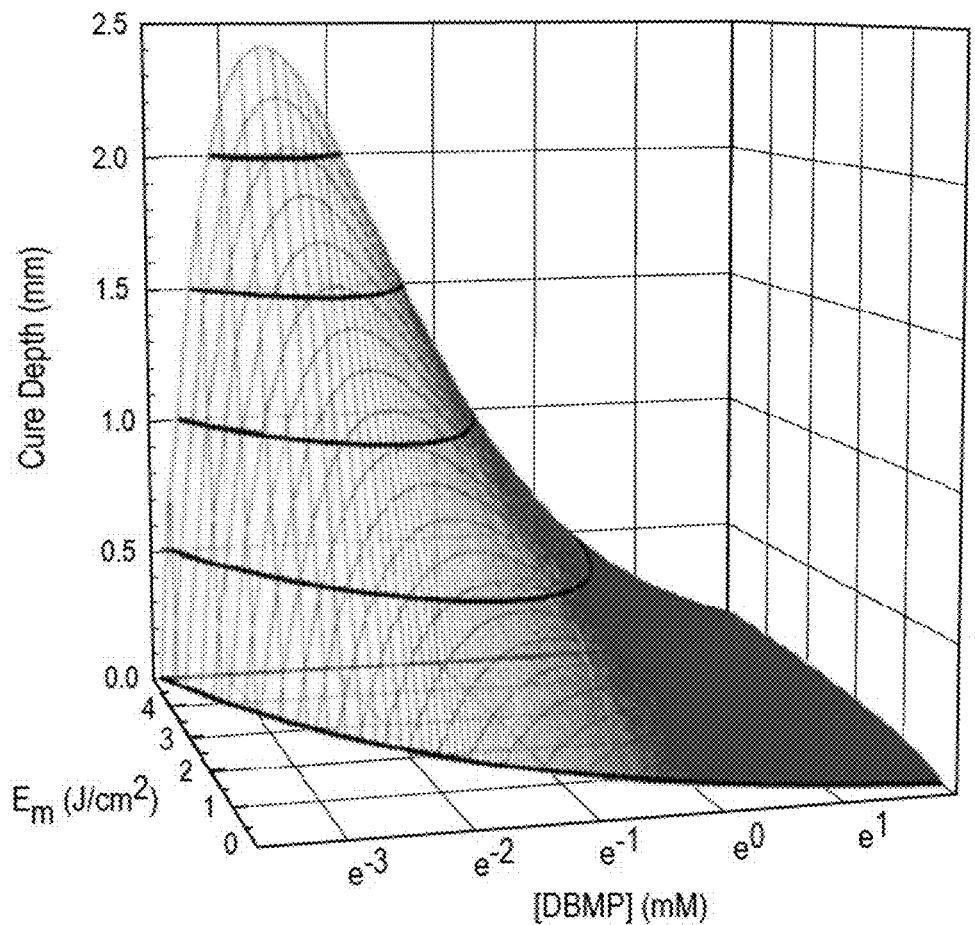
FIG. 5C illustrates a 3-dimensional map showing surface topology of curing space of the PID.

FIG. 5C illustrates a 3-dimensional map showing surface topology of curing space of the PID. Photoinitiator concentration is plotted on the x-axis, energy dosage is plotted on the y-axis, and cure depth is shown upward in the z direction. Note that cure depth increases exponentially as energy increases, while cure depth increases initially with increasing photoinitiator concentration, obtains a maximum, and then plateaus. The black contour lines mark the boundary of physically realizable cure space in the PID. The gray mesh lines correspond to discretized photoinitiator concentration and energy dosage values. Only the region enclosed by the mesh lines represents physically realizable cure space. Outside the black contour lines marks the boundary beyond which critical conversions are not obtained, and a coherent gel network is thus unable to form. For any given energy dosage, the map exhibits a maximum cure depth at a specific photoinitiator concentration. As the energy dosage increases, the optimal photoinitiator concentration decreases.

Figure 6:
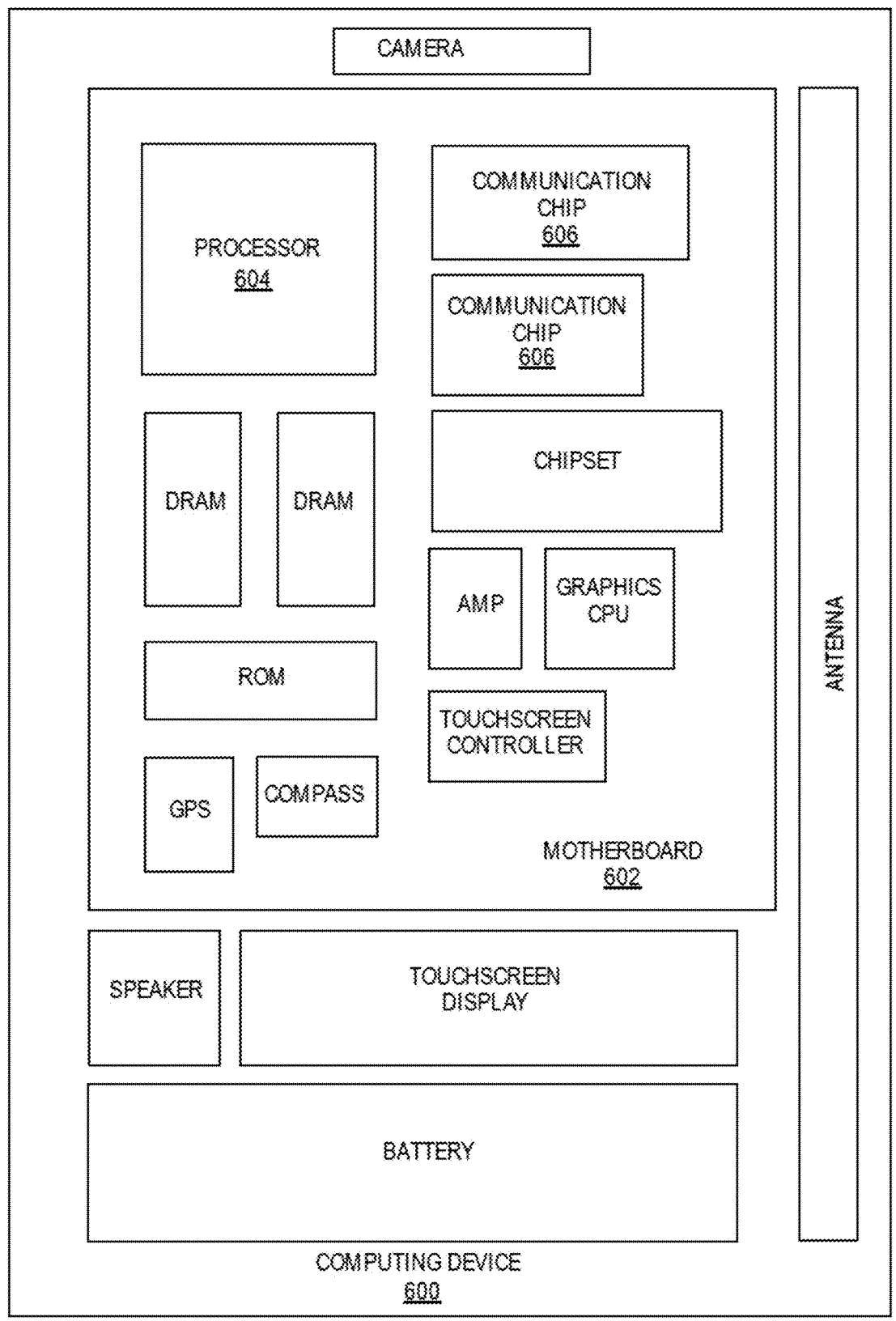
FIG. 6 illustrates a computing device in accordance with one implementation of an embodiment of the disclosure.

FIG. 6 illustrates a computing device 600 in accordance with one implementation of an embodiment of the disclosure. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In an embodiment, the integrated circuit die of the processor may include ultra-thin dielectric films using photo up-conversion, as described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In an embodiment, the integrated circuit die of the communication chip may include ultra-thin dielectric films using photo up-conversion, as described herein.

In further implementations, another component housed within the computing device 600 may contain an integrated circuit die that includes ultra-thin dielectric films using photo up-conversion, as described herein.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
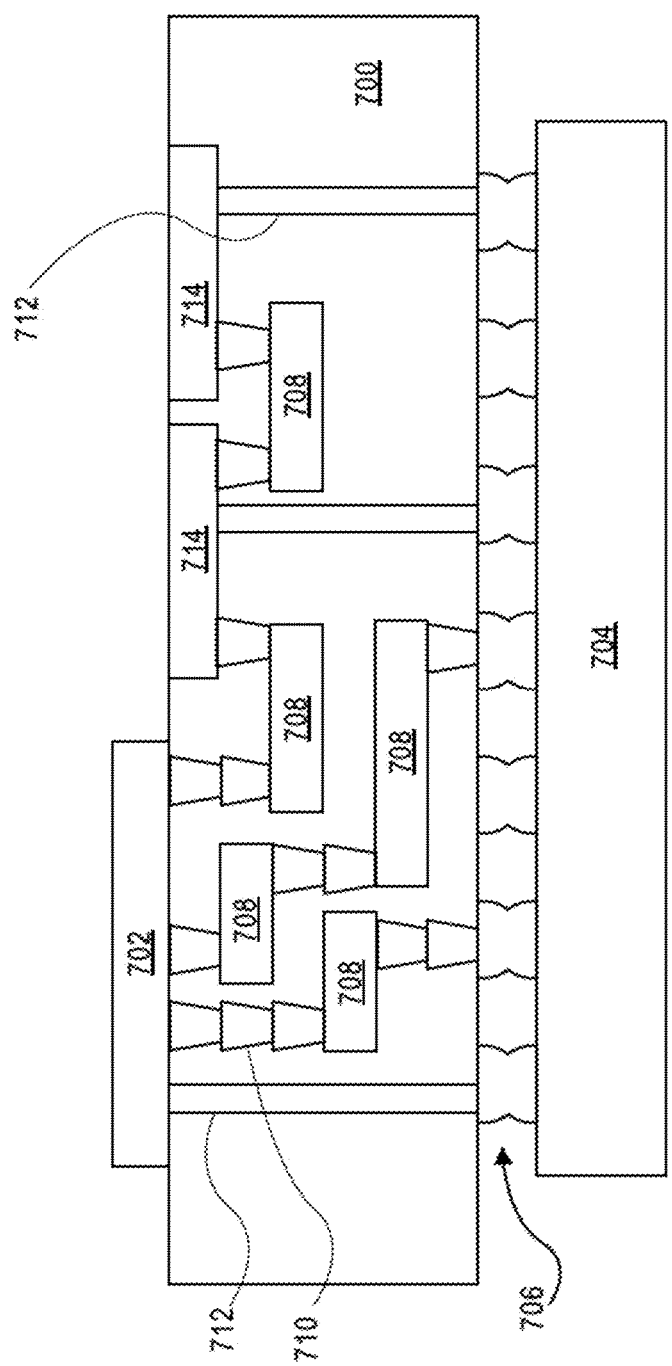
FIG. 7 illustrates an interposer that includes one or more embodiments of the disclosure.

FIG. 7 illustrates an interposer 700 that includes one or more embodiments of the disclosure. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the disclosure, apparatuses or processes disclosed herein may be used in the fabrication of interposer 700. Thus, embodiments of the present disclosure may include the substrate and/or the interposing having components comprising ultra-thin dielectric films using photo up-conversion for applications in substrate manufacturing, as described herein.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: A thin-film insulator comprises a first electrode over a substrate. A photo up-converting material is over the first electrode. A cured photo-imageable dielectric (PID) containing a high-k filler material is over the photo up-converting material, wherein the cured PID is less than 4 µm in thickness, and a second electrode is over the cured PID.

Example embodiment 2: the thin-film insulator of embodiment 1, wherein the photo up-converting material comprises one of a nanoparticle solid-state emitter and an organic phosphor-type emitter.

Example embodiment 3: the thin-film insulator of example embodiment 2, wherein the nanoparticle solid-state emitter comprises one of CdSe quantum dots, CuS nanodisks, and metal nanoparticle-infused polymers.

Example embodiment 4: the thin-film insulator of example embodiment 1, 2, or 3, wherein the photo up-converting material comprises Er and Yb-doped barium and strontium titanates.

Example embodiment 5: the thin-film insulator of example embodiment 1, 2, 3 or 4, wherein the PID containing the high-k filler material comprises at least one of: barium titanate, strontium titanate, barium and strontium titanate silicon carbides, nickel titanate, barium titanate, nickel and barium titanates, iron-doped fluoropolymers, and polyfluorovinyl polymers.

Example embodiment 6: the thin-film insulator of example embodiment 1, 2, 3, 4 or 5, wherein the cured PID is approximately 20 nm to 3 µm in thickness.

Example embodiment 7: the thin-film insulator of example embodiment 1, 2, 3, 4, 5 or 6, wherein the photo up-converting material is approximately 10 nm to 50 nm in thickness.

Example embodiment 8: the thin-film insulator of example embodiment 1, 2, 3, 4, 5, 6 or 7, wherein the first electrode and the second electrode comprise copper and are approximately 100 nm to 5 μm in thickness.

Example embodiment 9: A method of forming a thin film insulator comprises forming a photo up-converting material over a substrate. A photo-imageable dielectric (PID) is formed over the photo up-converting material. An infrared light is exposed through the PID such that the photo up-converting material absorbs the infrared light and emits a UV light that crosslinks a bottom portion of the PID to form a cured dielectric layer over the photo up-converting material and an uncured portion of the PID over the cured dielectric layer, wherein the cured dielectric layer is less than 4 μm in thickness. The uncured portion of the PID is removed to form a thin-film insulator.

Example embodiment 10: The method of example embodiment 9, further comprising: doping the PID with other materials, including, for example, a high dielectric constant material, piezoelectric material, thermoelectric material, diamagnetic material, paramagnetic material.

Example embodiment 11: The method of example embodiment 9 or 10, further comprising: varying the thickness of the cured dielectric layer by varying at least one of light intensity of the infrared light and a photo-initiator concentration of the PID.

Example embodiment 12: The method of example embodiment 9, 10 or 11, further comprising: forming the thin-film insulator as one of: a thin film capacitor, a diffusion barrier, a redistribution layer (RDL), adhesion promoting layers, and passivation layers.

Example embodiment 13: The method of example embodiment 9, 10, 11 or 12, further comprising: prior to forming the photo up-converting material over the substrate, forming a bottom electrode over the substrate and then forming the photo up-converting material over the bottom electrode.

Example embodiment 14: The method of example embodiment 13, wherein subsequent to removing the uncured portion of the PID, the method further comprises: forming a top electrode over the cured portion of the PID, such that the thin-film insulator comprises a thin-film capacitor.

Example embodiment 15: A method of forming a thin film insulator comprises forming a first electrode over a substrate. A photo up-converting material is formed over the first electrode. A photo-imageable dielectric (PID) is formed over the photo up-converting material. Low electromagnetic energy is exposed through the PID such that the photo up-converting material absorbs the low electromagnetic energy and emits high electromagnetic energy that crosslinks a bottom portion of the PID to form a cured dielectric layer over the photo up-converting material and an uncured portion of the PID over the cured dielectric layer, wherein the cured dielectric layer is less than 4 μm in thickness. The uncured portion of the PID is removed. A second electrode is formed over the cured dielectric layer.

Example embodiment 16: The method of example embodiment 15, further comprising: doping the PID with other materials, including, for example, a high dielectric constant material, piezoelectric material, thermoelectric material, diamagnetic material, paramagnetic material.

Example embodiment 17: The method of example embodiment 15 or 16, wherein the photo up-converting material comprises one of a nanoparticle solid-state emitter and an organic phosphor-type emitter.

Example embodiment 18: The method of example embodiment 17, wherein the nanoparticle solid-state emitter comprises one of CdSe quantum dots, CuS nanodisks, and metal nanoparticle-infused polymers.

Example embodiment 19: The method of example embodiment 15, 16, 17 or 18, wherein the photo up-converting material comprises Er and Yb-doped barium and strontium titanates.

Example embodiment 20: The method of example embodiment 15, 16, 17, 18 or 19, wherein the PID contains a high-k filler material and comprises at least one of: barium titanate, strontium titanate, barium and strontium titanate silicon carbides, nickel titanate, barium titanate, nickel and barium titanates, iron-doped fluoropolymers, and polyfluorovinyl polymers.

Example embodiment 21: The method of example embodiment 15, 16, 17, 18, 19 or 20, wherein the cured dielectric layer is approximately 20 nm to 3 μm in thickness.

Example embodiment 22: The method of example embodiment 15, 16, 17, 18, 19, 20 or 21, wherein the photo up-converting material is approximately 10 nm to 50 nm in thickness.

Example embodiment 23: The method of example embodiment 15, 16, 17, 18, 19, 20, 21 or 22, wherein the first electrode and the second electrode are approximately 100 nm to 5 μm in thickness.

What is claimed is:

1. A thin-film insulator, comprising:
   a first electrode over a substrate;
   a photo up-converting material over the first electrode;
   a cured photo-imageable dielectric (PID) over the photo up-converting material, wherein the cured PID is less than 4 μm in thickness; and
   a second electrode over the cured PID.

2. The thin-film insulator of claim 1, wherein the photo up-converting material comprises one of a nanoparticle solid-state emitter and an organic phosphor-type emitter.

3. The thin-film insulator of claim 2, wherein the nanoparticle solid-state emitter comprises one of CdSe quantum dots, CuS nanodisks, and metal nanoparticle-infused polymers.

4. The thin-film insulator of claim 1, wherein the photo up-converting material comprises Er and Yb-doped barium and strontium titanates.

5. The thin-film insulator of claim 1, wherein the PID containing a high-k filler material comprising at least one of: barium titanate, strontium titanate, barium and strontium titanate silicon carbides, nickel titanate, nickel and barium titanates, iron-doped fluoropolymers, and polyfluorovinyl polymers.

6. The thin-film insulator of claim 1, wherein the cured PID contains at least one of a high dielectric constant material, piezoelectric material, thermoelectric material, diamagnetic material, and paramagnetic material, and is approximately 20 nm to 3 μm in thickness.

7. The thin-film insulator of claim 1, wherein the photo up-converting material is approximately 10 nm to 50 nm in thickness.

8. The thin-film insulator of claim 1, wherein the first electrode and the second electrode comprise copper and are approximately 100 nm to 5 μm in thickness.

9. A method of forming a thin film insulator, comprising:
   forming a photo up-converting material over a substrate;

forming a photo-imageable dielectric (PID) over the photo up-converting material;

exposing low electromagnetic energy through the PID such that the photo up-converting material absorbs the low electromagnetic energy and emits high electromagnetic energy that crosslinks a bottom portion of the PID to form a cured dielectric layer over the photo up-converting material and an uncured portion of the PID over the cured dielectric layer, wherein the cured dielectric layer is less than 4 µm in thickness; and removing the uncured portion of the PID to form a thin-film insulator.

10. The method of claim 9, further comprises: doping the PID with other materials, including at least one of a high dielectric constant material, piezoelectric material, thermoelectric material, diamagnetic material, and paramagnetic material.

11. The method of claim 9 further comprising: varying the thickness of the cured dielectric layer by varying at least one of light intensity of the low electromagnetic energy and a photo-initiator concentration of the PID.

12. The method of claim 9, further comprising: forming the thin-film insulator as one of: a thin film capacitor, a diffusion barrier, a redistribution layer (RDL), adhesion promoting layers, and passivation layers.

13. The method of claim 9, further comprising: prior to forming the photo up-converting material over the substrate, forming a bottom electrode over the substrate and then forming the photo up-converting material over the bottom electrode.

14. The method of claim 13, wherein subsequent to removing the uncured portion of the PID, the method further comprises: forming a top electrode over the cured dielectric layer, such that the thin-film insulator comprises a thin-film capacitor.

15. A method of forming a thin film insulator, comprising:
   forming a first electrode over a substrate;
   forming a photo up-converting material over the first electrode;
   forming a photo-imageable dielectric (PID) over the photo up-converting material;
   exposing an infrared light through the PID such that the photo up-converting material absorbs the infrared light and emits a UV light that crosslinks a bottom portion of the PID to form a cured dielectric layer over the photo up-converting material and an uncured portion of the PID over the cured dielectric layer, wherein the cured dielectric layer is less than 4 µm in thickness;
   removing the uncured portion of the PID; and
   forming a second electrode over the cured dielectric layer.

16. The method of claim 15, further comprises: doping the PID with other materials, including, at least one of a high dielectric constant material, piezoelectric material, thermoelectric material, diamagnetic material, and paramagnetic material.

17. The method of claim 15, wherein the photo up-converting material comprises one of a nanoparticle solid-state emitter and an organic phosphor-type emitter.

18. The method of claim 17, wherein the nanoparticle solid-state emitter comprises one of CdSe quantum dots, CuS nanodisks, and metal nanoparticle-infused polymers.

19. The method of claim 15, wherein the photo up-converting material comprises Er and Yb-doped barium and strontium titanates.

20. The method of claim 15, wherein the PID contains a high-k filler material and comprises at least one of: barium titanate, strontium titanate, barium and strontium titanate silicon carbides, nickel titanate, nickel and barium titanates, iron-doped fluoropolymers, and polyfluorovinyl polymers.

21. The method of claim 15, wherein the cured dielectric layer is approximately 20 nm to 3 µm in thickness.

22. The method of claim 15, wherein the photo up-converting material is approximately 10 nm to 50 nm in thickness.

23. The method of claim 15, wherein the first electrode and the second electrode are approximately 100 nm to 5 µm in thickness.

* * * * *